United States Patent

[11] 3,603,897

[72] Inventors Stanley J. Grubel
Wappingers Falls;
Joseph E. La Rou, Fishkill; Hugh R.
Stirling, Poughkeepsie, all of, N.Y.
[21] Appl. No. 829,632
[22] Filed June 2, 1969
[45] Patented Sept. 7, 1971
[73] Assignee International Business Machines
Corporation
Armonk, N.Y.

[54] PULSE CIRCUIT EMPLOYING DELAY LINE TO DELIMIT OUTPUT FREQUENCY
3 Claims, 6 Drawing Figs.

[52] U.S. Cl. ........ 331/107 T, 307/258, 331/177, 307/286
[51] Int. Cl. ........ H03b 7/08
[50] Field of Search ........ 331/107, 107 T, 175, 177, 174; 307/258, 286

[56] References Cited
UNITED STATES PATENTS

| | | | |
|---|---|---|---|
| 3,317,855 | 5/1967 | Cho | 331/107 (T) X |
| 3,408,592 | 10/1968 | Herzog | 331/107 (T) X |
| 3,453,448 | 7/1969 | Close | 307/286 X |
| 3,458,733 | 7/1969 | Kosonocky | 331/107 (T) X |

*Primary Examiner*—Alfred L. Brody
*Attorney*—Hanifin and Jancin

ABSTRACT: The circuit includes a tunnel diode latch, a detector for sensing the level or state of the latch, an enabler for switching the latch between states, and a delay line coupling the detector to the enabler, for setting and resetting the enabler to thereby switch the latch between states. Since the latch must be reset before the next output pulse can be obtained, the output frequency of the circuit is a function of the delay line length, the time between successive output signals being at least twice the length of the delay line.

INVENTORS
STANLEY J. GRUBEL
JOSEPH LA ROU
HUGH R. STIRLING

BY Joseph L. Spiegel
ATTORNEY

PULSE CIRCUIT EMPLOYING DELAY LINE TO DELIMIT OUTPUT FREQUENCY

BACKGROUND OF THE INVENTION

1. Field of the Invention

This invention relates to pulse circuit arrangements in which the frequency of its output signal can be limited to a desired maximum frequency. An example of such an arrangement would be a countdown circuit for providing, from input pulses occurring at a given number of pulses per unit of time, output pulses in said unit of time no greater than a desired number. While not so limited, the invention finds immediate application in the field of test equipment by enabling low repetition rate measuring equipment to synchronize on signals of much higher frequency.

2. Description of the Prior Art

In a countdown circuit timing synchronization has to be a constant. Also, the delay between occurrence of an output and input signal must remain a fixed increment over a long interval of pulses. Previously known countdown circuit arrangements are characterized by delay drift and high jitter somewhat greater than 100 picoseconds.

Summary of the Invention

An object of the invention is a pulse circuit arrangement whose output frequency can be limited to a desired maximum frequency.

Another object of the invention is the provision of an extremely stable countdown circuit arrangement for providing, from input pulses occurring at a given number of pulses per unit of time, output pulses in said unit of time no greater than a desired number.

Still another object is the provision of such an arrangement in which the input pulse triggers not only the output, but also the output repetition rate determining means.

A further object is such a circuit arrangement in which the maximum output repetition rate can be varied and independently of the repetition rate of any input signal.

These and other objects are accomplished in accordance with the present invention, one illustrative embodiment of which comprises: a tunnel diode latch having an enable off-state, inhibit on-state when it may detect an input pulse and an inhibit off-state; a current switch detector coupled to the latch, providing when the latch switches from its enable off-state to its inhibit on-state, an output pulse and a triggering pulse in one direction and providing when the latch switches from its inhibit on-state to its inhibit off-state a triggering pulse in opposite direction; an enabler for switching the latch between states; and, delay means coupling the detector and enabler for switching the latch from its inhibit on-state to its inhibit off-state in response to the triggering pulse in one direction and from its inhibit off-state to its enable off-state in response to the triggering pulse in opposite direction.

BRIEF DESCRIPTION OF THE DRAWING

The foregoing and other objects, features and advantages of the invention will be apparent from the following, more particular description of the preferred embodiments of the invention, as illustrated in the accompanying drawing, wherein.

DESCRIPTION OF THE PREFERRED EMBODIMENTS

Figure 1:
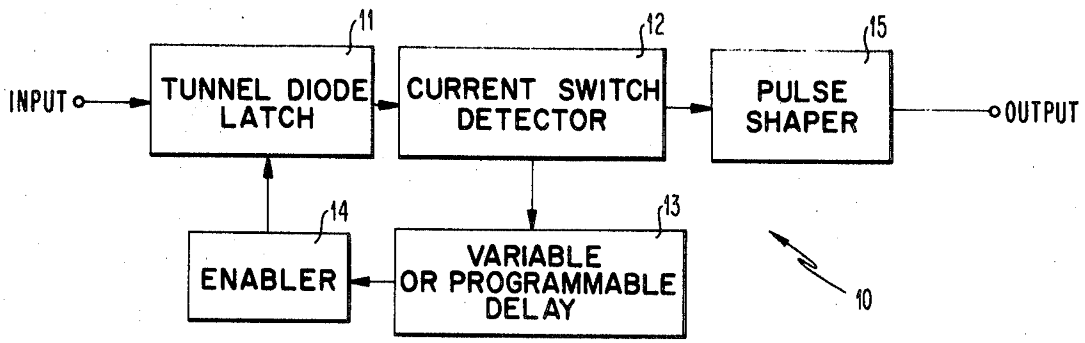
FIG. 1 is a simplified block diagram of a preferred embodiment of the present invention illustrating a countdown circuit arrangement.

Reference will now be had to FIG. 1 which illustrates the countdown circuit arrangement 10 of the present invention in simplified block diagram form.

Pulses from a pulse source (not shown) are applied to the input terminal of the circuit 10. The pulses applied to the input terminal may have a pulse repetition rate of up to 100mHz. or higher. Because of inherent limitations, certain presently available test equipment is only capable of operation at much lower repetition rates, say 200kHz. The purpose of the circuit 10 is to provide a signal at its output terminal whose frequency in no greater than a desired limit, say 200kHz., regardless of the repetition rate of the input signal. If the frequency of the input signal is above 200kHz., circuit 10 counts the frequency down to provide a signal at its output terminal which is below 200kHz. However, if the signal input is below 200kHz., the signal at the output terminal will be at the same frequency as the input signal.

The circuit 10 is shown as including: a tunnel diode latch 11; a current switch detector 12; variable or programmable delay means 13; enabler 14; and, pulse shaper 15.

Upon application of a pulse to latch 11, latch 11 switches from an enable off-state to an inhibit on-state. Detector 12 senses the change and provides an output pulse to the output terminal via pulse shaper 15. At the same time the detector 12 provides a triggering pulse in one direction. The pulse is delayed by means 13 and then applied to enabler 14, which resets the latch 11 to its inhibit off-state. With latch 11 now switched to inhibit off, detector 12 senses and then provides a triggering pulse in opposite direction, which is delayed, then applied to enabler 14. Enabler 14 then switches latch 11 to its enable off-state. This condition holds until a new positive pulse arrives, whereupon a new cycle begins.

Figure 3:
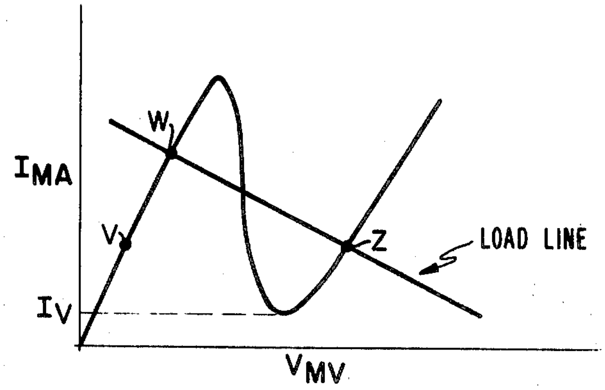
FIG. 3 shows the characteristic current-voltage relationship of a tunnel diode.
Figure 4:
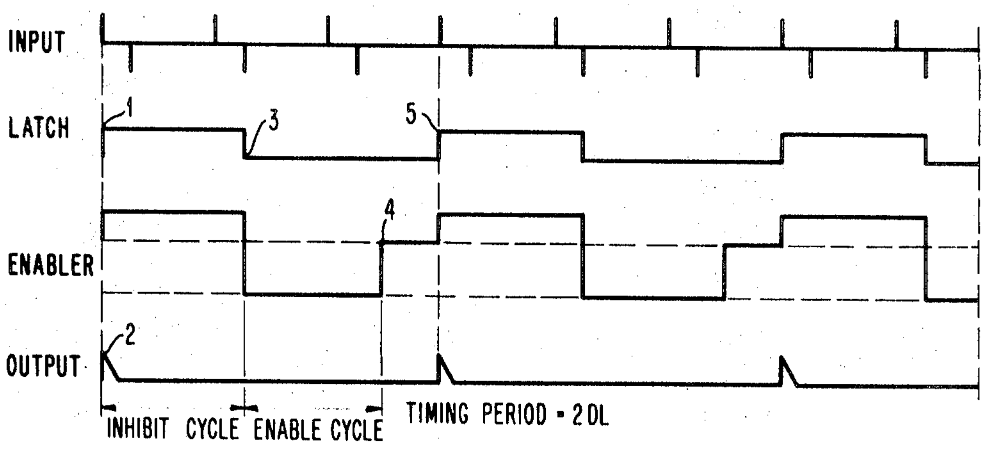
FIG. 4 depicts the waveforms, all shown with respect to the same time base, encountered at various points of the circuit shown in FIG. 2.
Figure 2:
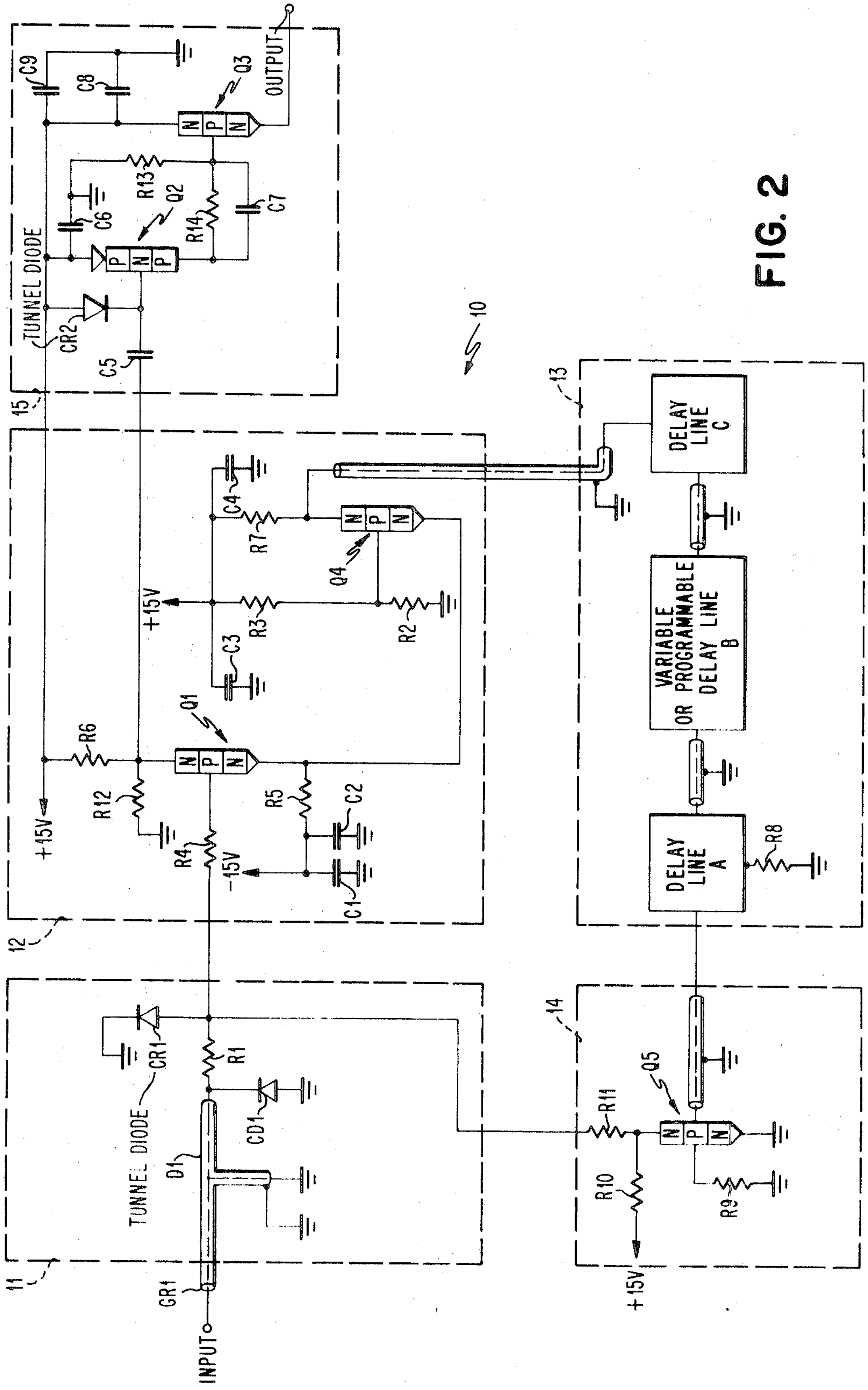
FIG. 2 is a circuit diagram of the countdown circuit arrangement of FIG. 1.

For a more complete understanding of countdown circuit 10, reference will now be had to FIGS. 2–4. Initially, tunnel diode CR1 of latch 11 is at its enable off-state (point W on its characteristic curve). A positive square wave pulse from an external clock (not shown) is applied to the input at plug GR1. Since the delay line D1 is terminated in a short, the out of phase reflection causes a positive voltage spike to appear at the intersection of R1 and the delay line D1. Alternatively, a sine wave signal whose amplitude is sufficient to switch diode CR1 may be provided, in which case the line need not be shorted. In either case sufficient current is provided to fire tunnel diode CR1 and switch it to its inhibit on-state (point Z on its characteristic curve). In this on-state, the negative edge of the applied pulse or wave should not reset CR1 to its off-state. If the negative edge of the signal was large enough to reset diode CR1, the signal would be clipped by means of a hot carrier diode CD1.

In detector 12 the differentially paired transistors Q1 and Q4 function as a current switch, with the transistor whose base is at the most positive potential conducting. Before tunnel diode CR1 fires Q1 has at its base, the drop across Cr1 in its low voltage state. Transistor Q4, therefore, is conducting with the potential developed across the divider R2, R3 at its base.

When CR1 is biased on, in current switch detector 12 transistor Q1 then turns on. Resistor R4 isolates Q1 from CR1 so that Q1 doesn't load down CR1 when Q1 turns on. Resistor R5 acts to control the current switched from Q4 to Q1. Capacitors C1 and C2 act to filter noise from the −15 v. power supply to the circuit and vice versa. Resistor R6 acts to prevent Q1 from saturating and sets the down level on the collector.

When Q4 turns off, its collector begins to rise towards +15 V. DC, the bias voltage. Capacitors C3 and C4 are bypass capacitors to filter noise. Resistor R7 sets the down level on the collector.

The positive pulse on Q4's collector is delayed say, 2.5$\mu$s by the three delay lines A, B and C, forming delay means 13, then applied to the base of transistor Q5 of enabler 14, turning Q5 on. Resistors R8 and R9 serve to terminate the line. When Q5 turns on, the tunnel diode CR1 bias current which had been flowing through R10 and up through R11 will be shunted to ground through Q5. The current in CR1 drops below its minimum current point ($I_V$ on its characteristic curve) and the diode resets to its inhibit off-state (point V on its characteristic curve).

With diode CR1 at inhibit off, the base of Q1 is more negative than the base of Q4. Therefore, Q1 turns off and Q4 turns on. The collector voltage of Q4 begins to drop. This negative signal will propagate down the delay means 13 and 2.5$\mu$s later, this signal is applied to the base of Q5 back-biasing same and turning it off. With Q5 off the bias current of CR1 is increased to point W on its characteristic curve. The next positive pulse will cause CR1 to fire and the cycle will be repeated. However, when CR1 is at its inhibit off-state, it will not fire, no matter how many pulses are applied to it.

Transistors Q2 and Q3 in the pulse shaper 15 couple the feedback loop signal to the output terminal. When diode CR1 fires and Q1 turns on, capacitor Q5 momentarily couples the signal to the cathode of tunnel diode CR2, turning CR2 and Q2 on. Resistor R12 provides a discharge path for capacitor C5. C6 functions as a bypass to ground so that current can be switched rapidly. Tunnel diode CR2 is used to turn on Q2 because of the diode's extremely fast switching. With Q2 turned on, emitter follower Q3 turns on and the pulse is applied to the output terminal. The capacitor C7 allows Q3 to be turned on rapidly. Capacitors C8 and C9 function as bypass capacitors. As the base of Q2 charges towards +15v. DC, the current through CR2 drops below its minimum current point, causing CR2, Q2 and Q3 to reset. Resistors R13 and R14 control the final output up level.

The sequence of events is illustrated in FIG. 4. Assume that an input pulse train such as that shown in FIG. 4 is applied to tunnel diode CR1. The amplitude of the positive pulse is sufficient that its leading edge switches the diode CR1 into its high voltage state (point 1). A pulse is transmitted via detector 12 and pulse shaper 15 to the output terminal (point 2). The detector 12 is also coupled to the enabler 14 via the delay means 13. A period of time later, DL, the enabler switches latch 11 to inhibit off-state (point 3). The change of state is sensed by detector 12 to provide a second, oppositely directed, delayed triggering pulse. The tunnel diode is now in enable-off condition (point 4). Upon occurrence of the next positive pulse, the cycle recommences (point 5).

The output frequency, F out lies within a band of frequencies equal to or less than 1/2DL. The output and input are always in synchronization, with jitter less than 10 picoseconds. Also, if $F$ in $< 1/2DL$ then $F$ out $= F$ in if $F$ in $\geq 1/2DL$ then $F$ out $= 1/2DL$ for all harmonics of $1/2DL$ and $F$ out $= (F \text{ in}/F_x)$ $(1/2DL$ for inharmonics where $F_x$ is the first harmonic of $1/2DL$ above $F$ in.

It will be appreciated that the use of a variable delay element such as a programmable delay means will provide a variable or programmable output frequency.

By way of example, in a physical embodiment according to FIG. 4, the circuit components are as follows:

| | |
|---|---|
| tunnel diode CR1 | G.E. TD 253B |
| delay line D1 | 4"50 ohm coax |
| resistor R1 | 360 ohms |
| diode CD1 | Hewlett Packard 2301 |
| transistor Q1 | Transitron 2N2784 |
| transistor Q4 | Transitron 2N2784 |
| resistor R2 | 100 ohms |
| resistor R3 | 7.5 K-ohms |
| resistor R4 | 100 ohms |
| resistor R5 | 1.5 K-ohms |
| capacitor C1 | 1 $\mu$f. |
| capacitor C2 | 10 $\mu$f. |
| resistor R6 | 1.5 K-ohms |
| capacitor C3 | 0.1 $\mu$f. |
| capacitor C4 | 10 $\mu$f. |
| resistor R7 | 750 ohms |
| delay line A | 0.5 $\mu$s. |
| delay line B | 1.0 $\mu$s. |
| delay line C | 1.0 $\mu$s. |
| transistor Q5 | 2N2369 |
| resistor R8 | 100 ohms |
| resistor R9 | 100 ohms |
| resistor R10 | 1.5 K-ohms |
| resistor R11 | 360 ohms |
| transistor Q2 | IBM 101 |
| transistor Q3 | Transitron 2N2784 |
| capacitor C5 | 10 pf. |
| resistor R12 | 390 ohms |
| capacitor C6 | 0.1 $\mu$f. |
| tunnel diode CR2 | TD 251A |
| capacitor C7 | 10 pf. |
| capacitor C8 | 0.1 $\mu$f. |
| capacitor C9 | 10 $\mu$f. |
| resistor R13 | 390 ohms |
| resistor R14 | 1.5 K-ohms |

Figure 5:
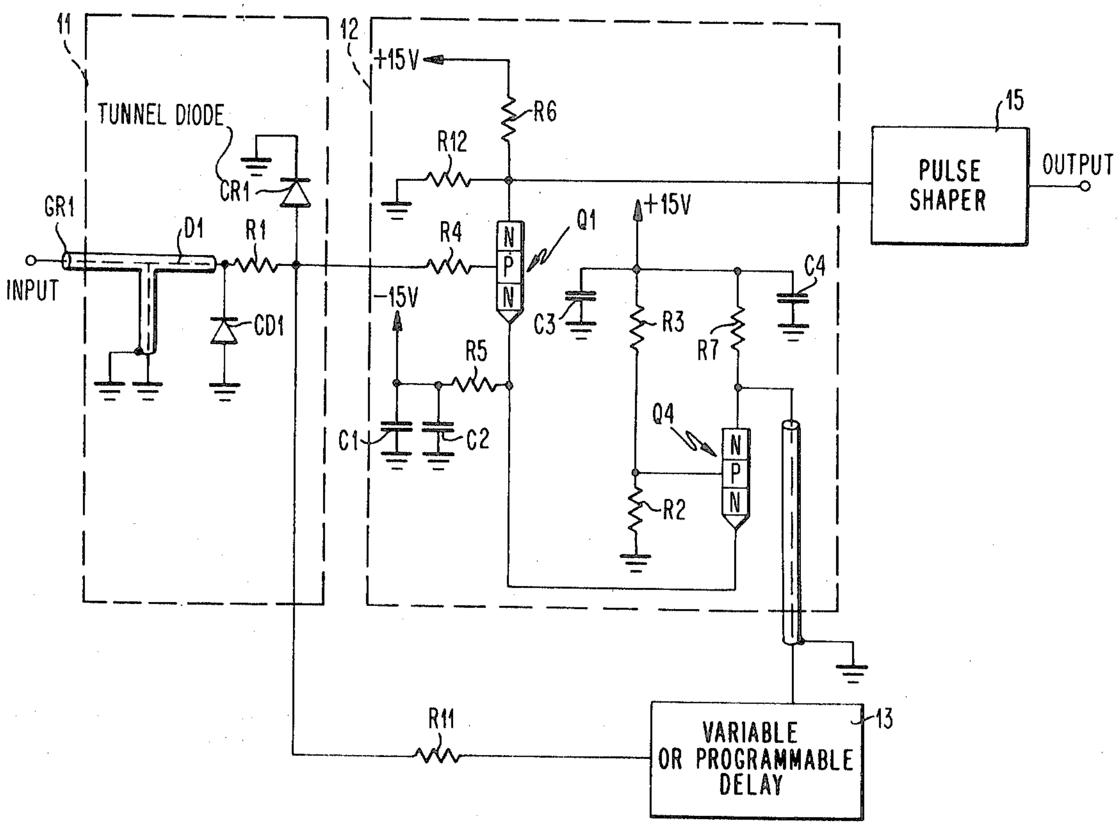
FIG. 5 shows, partially in block diagram form and partially in circuit schematic, an alternate embodiment of a countdown circuit arrangement, constructed in accordance with the teachings of the present invention; and, FIG. 6 shows, partially in block diagram form and partially in circuit schematic, an oscillator constructed in accordance with the teachings of the present invention.

FIG. 5 shows an alternate embodiment of a countdown circuit arrangement, constructed in accordance with the teachings of the present invention. Elements similar to those used in the preferred embodiment of FIGS. 1–4 have the same reference numerals. In this embodiment the delay means 13 is connected directly from the current switch detector 12 through biasing resistor R5 to tunnel diode CR1 of latch 11.

Upon application of a pulse to latch 11, latch 11 switches from an enable off-state to an inhibit on-state. Detector 12 senses the change and provides an output pulse to the output terminal via pulse shaper 15. At the same time the detector 12 provides a triggering pulse in one direction. The pulse is delayed by means 13 and then applied directly to tunnel diode CR1 which resets the latch 11 to its inhibit off-state. With latch 11 now switched to inhibit off, detector 12 senses and then provides a triggering pulse in opposite direction, which is delayed by means 13 and then applied again directly to tunnel diode CR1. The latch 11 switches to its enable off-state. This condition holds until a new positive pulse arrives whereupon a new cycle begins.

Figure 6:
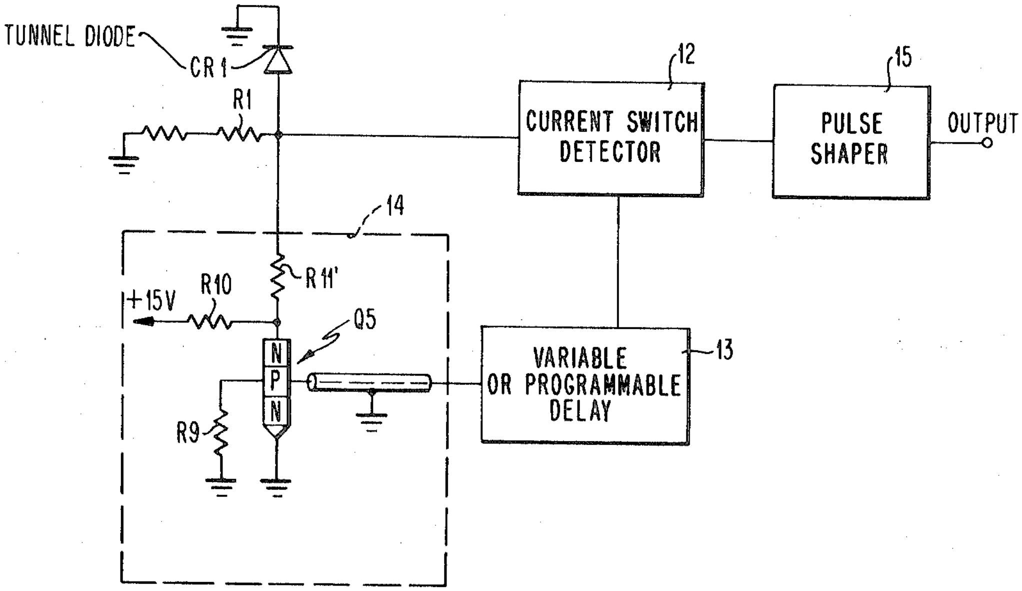

FIG. 6 shows an oscillator constructed in accordance with the teachings of the present invention. The arrangement and operation of the oscillator is essentially the same as the countdown circuit arrangement depicted at FIG. 2 except that now the input means has been removed and the bias on tunnel diode CR1 has been changed as by using a lower valued resistor for R11 so that the circuit self oscillates.

What is claimed is:

1. A countdown circuit arrangement responsive to input pulses comprising:

a latch having an on-state and an off-state and when conditioned responsive to an input pulse to switch from its off-state to its on-state;

a differentially paired transistor detecting circuit having a first transistor coupled to said latch for sensing the state of said latch, said circuit providing an output signal from the first transistor and a triggering signal in one direction from a second transistor when said latch switches from its off-state to its on-state, and a triggering signal in the opposite direction from the second transistor when said latch switches from its on-state to its off-state; and means coupling the second transistor of said detecting circuit to said latch, and responsive to said triggering signal in one direction for switching said latch to its off-state but inhibited from switching to its on-state and for conditioning said latch to switch to its on-state in response to said triggering signal in the opposite direction, said coupling means including signal delay means for determining when said triggering signals are applied to said latch, whereby the occurrence of said output signal is a function of the length of said signal delay means.

2. A countdown circuit arrangement for providing, from input pulses occurring at a given number of pulses per unit of time, output pulses in said unit of time no greater than a desired number, comprises:

a tunnel diode latch having an enable off-state when it may detect an input pulse inhibit on-state and an inhibit off-state;

a differentially paired transistor detecting circuit having a first transistor coupled to said latch for sensing the state of said latch and providing, when said latch switches from its enable off-state to its inhibit on-state an output pulse from the first transistor and a triggering pulse in one direction from a second transistor, and when said latch switches from its inhibit on-state to its inhibit off-state a triggering pulse in the opposite direction from the second transistor; and programmable delay means coupling the second transistor of said detecting circuit to said latch, for switching said latch from its inhibit on-state to its inhibit off-state in response to said triggering pulse in one direction and from its inhibit off-state to its enable off-state in response to said triggering pulse in the opposite direction, whereby the number of output pulses occurring in said unit of time is determined by the duration of said delay means.

3. The circuit arrangement as defined in claim 1, wherein said delay means includes a variable element.